(12) United States Patent
Kicin et al.

(10) Patent No.: US 8,749,051 B2
(45) Date of Patent: Jun. 10, 2014

(54) SEMICONDUCTOR DEVICE

(75) Inventors: Slavo Kicin, Zurich (CH); Nicola Schulz, Turgi (CH); Munaf Rahimo, Uezwil (CH); Raffael Schnell, Seon (CH)

(73) Assignee: ABB Research Ltd, Zurich (CH)

( * ) Notice: Subject to any disclaimer, the term of this patent is extended or adjusted under 35 U.S.C. 154(b) by 117 days.

(21) Appl. No.: 13/367,987

(22) Filed: Feb. 7, 2012

(65) Prior Publication Data

US 2012/0199954 A1 Aug. 9, 2012

(30) Foreign Application Priority Data

Feb. 8, 2011 (EP) .................................... 11153710
Apr. 20, 2011 (EP) .................................... 11163114

(51) Int. Cl.
*H01L 23/10* (2006.01)
(52) U.S. Cl.
USPC ........... 257/706; 257/625; 257/707; 257/712; 257/796; 361/676; 361/697; 361/711
(58) Field of Classification Search
USPC ................. 257/276, 625, 675–677, 706–707, 257/712–713, 717–720, 796, E33.075, 257/E23.08–E23.088, E23.101, E23.105, 257/E31.131, E23
See application file for complete search history.

(56) References Cited

U.S. PATENT DOCUMENTS

2004/0061206 A1\* 4/2004 Son et al. ...................... 257/675
2011/0037166 A1\* 2/2011 Ikeda et al. .................... 257/712

\* cited by examiner

*Primary Examiner* — Steven Loke
*Assistant Examiner* — Cuong B Nguyen
(74) *Attorney, Agent, or Firm* — Buchanan Ingersoll & Rooney PC

(57) ABSTRACT

A semiconductor device which provides a small and simple design with efficient cooling. A first electrically conducting cooling element is in contact with first electrodes of semiconductor elements for forwarding a heat load from the semiconductor elements and for electrically connecting the first electrodes of the semiconductor elements to an external apparatus. A second electrically conducting cooling element is in contact with second electrodes of the semiconductor elements for forwarding a heat load from the semiconductor elements and for electrically connecting the second electrodes of the semiconductor elements to an external apparatus. The semiconductor device includes an interface which is electrically connected to gates of the semiconductor elements for external control of respective states of the semiconductor elements.

16 Claims, 2 Drawing Sheets

SEMICONDUCTOR DEVICE

RELATED APPLICATION

This application claims priority under 35 U.S.C. §119 to European Patent Application No. 11153710.6 filed in Europe on Feb. 8, 2011 and European Patent Application No. 11163114.9 filed in Europe on Apr. 20, 2011, the entire content of which is hereby incorporated by reference in its entirety.

FIELD

The present disclosure relates to a semiconductor device. More particularly, the present disclosure relates to a semiconductor device which provides high current density in combination with efficient cooling.

BACKGROUND INFORMATION

Known semiconductor devices are negatively effected by heat generated during use. Heat generation often limits operation of the devices. Known semiconductor devices have been provided with a cooling arrangement in order to forward the generated heat from the semiconductor device to the surroundings. The cooling arrangement may involve one or two cooling elements.

One drawback involved with the above-mentioned semiconductor devices is that internal wiring and efficient cooling of the devices increases the size of the device and makes the structure of the device complex.

SUMMARY

An exemplary embodiment of the present disclosure provides a semiconductor device which includes semiconductor elements, a cooling arrangement for cooling said semiconductor elements, an interface which is electrically connected to gates of the semiconductor elements for controlling a respective state of the semiconductor elements. The semiconductor elements are reverse conducting semiconductor switches each including a first electrode and a second electrode, respectively. The first and second electrodes are arranged on opposite sides of the semiconductor elements, respectively. The cooling arrangement includes a first cooling element in contact with the first electrodes of the semiconductor elements for forwarding a heat load from the semiconductor elements to the first cooling element. The first cooling element is made of an electrically conductive material to electrically connect the first electrodes of the semiconductor elements to an external apparatus. The cooling arrangement includes a second cooling element in contact with the second electrodes of the semiconductor elements for forwarding a heat load from the semiconductor elements to the second cooling element. The second cooling element is made of an electrically conductive material to electrically connect the second electrodes of the semiconductor elements to an external apparatus.

BRIEF DESCRIPTION OF DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a semiconductor device which solves the above-mentioned drawbacks by providing a relatively small and simple semiconductor device with an efficient cooling and thus maximized current density per semiconductor chip and power density in a power electronic module.

For instance, an exemplary embodiment of the present disclosure provides a semiconductor device which includes semiconductor elements, and a cooling arrangement for cooling the semiconductor elements. In accordance with an exemplary embodiment, the semiconductor elements are reverse conducting semiconductor switches including a first electrode and a second electrode. The first and second electrodes are arranged on opposite sides of the semiconductor elements, respectively. The cooling arrangement includes a first cooling element in contact with the first electrodes of the semiconductor elements for forwarding a heat load from the semiconductor elements to the first cooling element. In accordance with an exemplary embodiment, the first cooling element is made of an electrically conductive material in order to electrically connect the first electrodes of the semiconductor elements to an external apparatus. The cooling arrangement also includes a second cooling element in contact with the second electrodes of the semiconductor elements for forwarding a heat load from the semiconductor elements to the second cooling element. In accordance with an exemplary embodiment, the second cooling element is made of an electrically conductive material in order to electrically connect the second electrodes of the semiconductor elements to an external apparatus. The exemplary semiconductor device also includes an interface which is electrically connected to gates of the semiconductor elements for controlling the state of the semiconductor elements.

A solution where the electrodes of the reverse conducting semiconductor switches are in contact with the cooling elements made of an electrically conducting material makes it possible to utilize the same parts of the semiconductor device for cooling and for electrical connections. This simplifies the internal wiring of the semiconductor device and makes it possible to obtain a simple and compact structure utilizing the full current capabilities of the reverse conducting semiconductor switches and an efficient double sided cooling.

Exemplary embodiments of the disclosure are described in more detail below with reference to the drawings.

Figure 1:
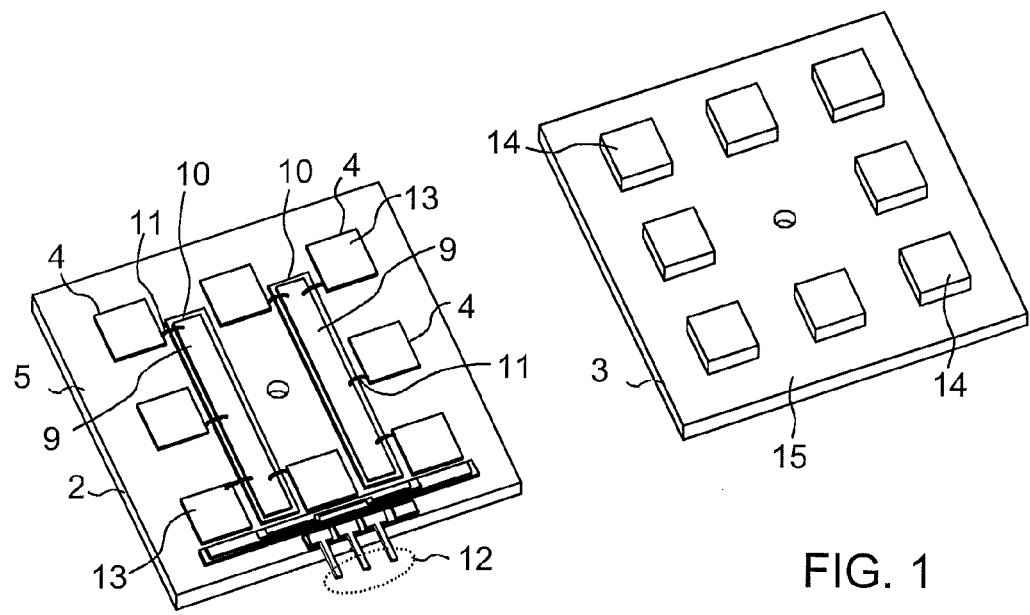
FIG. 1 illustrates a semiconductor device before assembly according to an exemplary embodiment of the present disclosure.
Figure 2:
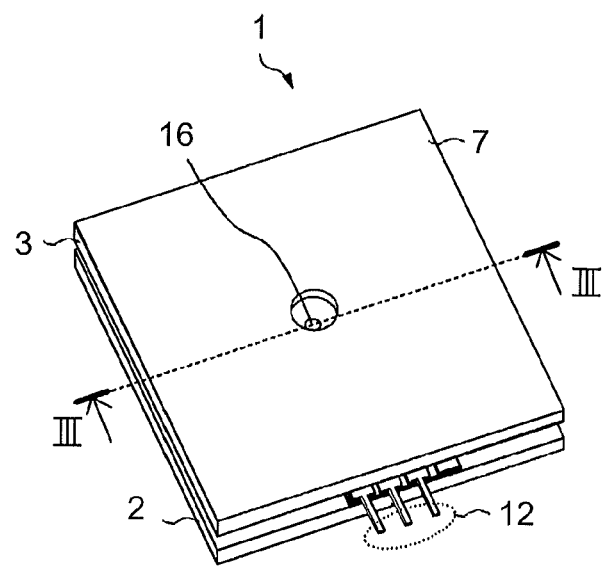
FIG. 2 illustrates the semiconductor device of FIG. 1 after assembly according to an exemplary embodiment of the present disclosure.
Figure 3:
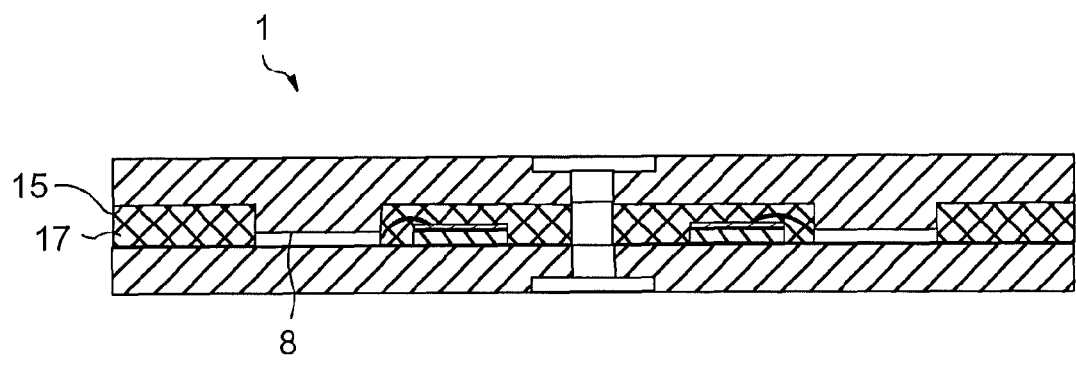
FIG. 3 is a cross section of the semiconductor device of FIG. 2 according to an exemplary embodiment of the present disclosure.

FIGS. 1 to 3 illustrate a semiconductor device 1 according to an exemplary embodiment of the present disclosure. The semiconductor device 1 includes a cooling arrangement which includes a first cooling element 2 and a second cooling element 3. In accordance with an exemplary embodiment, the cooling elements 2 and 3 are manufactured of an electrically conductive material in order to facilitate the first and second electrodes of the semiconductor elements 4 to be electrically connected to an external apparatus via these cooling elements 2 and 3, respectively. For this purpose, the outer surfaces 6 and 7 of the cooling elements 2 and 3 may be equipped with cable clamps, for example. As illustrated in the drawings, the first and second electrodes, one of which may be an anode and the other a cathode, are arranged on opposite sides of the semiconductor elements, respectively.

In the illustrated example, an inner surface 5 of the first cooling element 2 is provided with eight semiconductor elements 4. The illustrated semiconductor elements 4 all have a respective first electrode 8 in contact with the inner surface 5 of the first cooling element 2. A suitable electrically conductive material may be used for bonding the first electrodes 8 to the first cooling element 2. One example is to utilize a layer of solder or a layer of sintered silver.

The inner surface 5 of the first cooling element 2 is also provided with electrically conductive paths 9 which are separated from the inner surface 5 by a layer 10 of an electrically insulating material. One example of providing the electrically conductive paths 9 and the insulating material layer 10 is to utilize one or more PCB (Printed Circuit Board) or a ceramic structure (AlN, SiN, AlO) with metallization (Cu, Al) such as a DBC (Direct Bonding Copper) or AMB (Active Metal Brazing). The conductive paths 9 are connected to gates of the semiconductor elements 4 via wires 11, for example.

The semiconductor device 1 also includes an interface 12, which in this example includes three protruding pins. These pins are connected to the electrical conductive paths 9. One example is that two of the pins are utilized for electrifying the gates of the semiconductor element 4 for external control of the state of the semiconductor elements 4. In this way, all the semiconductor elements 4 may be simultaneously brought into a first state where a path from their first electrodes 8 to their second electrodes 13 is electrically conductive, and simultaneously into a second state, where the path from their first electrodes to their second electrodes 13 is not electrically conductive. This makes it possible to utilize the semiconductor device 1 as a switch where the switching is accomplished by changing the state of the semiconductor elements 4 connected in parallel between the first cooling element 2 and the second cooling element 3. The third pin of the interface 12, if provided, may be utilized for obtaining state information from the semiconductor device 1 to external control equipment. Instead of pins, any other type of conductors may be used, such as connectors, cables or wires, for example.

In the illustrated embodiment, it is assumed by way of example that an inner surface 15 of the second cooling element 3 is provided with protrusions or spacers 14 at the locations of the inner surface 15 that come into contact with the second electrodes 13 of the semiconductor elements 4. These protrusions may be an integrated, fixed part of the plate like the second cooling element 3 or alternatively separate electrically conductive elements arranged in the correct positions during assembly of the semiconductor device 1. Thanks to these protrusions or spacers 14, it can be ensured that the electrically conductive paths 9 and/or edges of the semiconductor elements 4 do not come into contact with the second cooling element 3 when the second cooling element 3, as illustrated in FIG. 1, is arranged on top of the semiconductor devices 4 in order to assemble the semiconductor device 1, as illustrated in cross section in FIG. 3. The protrusions may be of the same material as the second cooling element 3, or alternatively, of another material (such as, for example, Al-graphite, Cu-graphite, Molybdenum, Moly-alloys, etc.) with sufficient performance regarding coefficient of thermal expansion, thermal and electrical conductivity.

In order to obtain a good and reliable electrical contact between the second electrodes 13 of the semiconductor elements 4 and the second cooling element 3, a suitable bonding material may be arranged between the second electrodes 13 and the protrusions 14. One example is to utilize a layer of solder or of sintered silver.

In the cross sectional representation of FIG. 3, it is assumed by way of example that a space between the first and second cooling elements 2 and 3 is at least partly filled with an electrically insulating material 17, such as silicone gel, or epoxy, for example.

In order to facilitate simple mounting of the semiconductor device 1, the semiconductor device 1 is in the illustrated example provided with a hole 16 extending through it. This hole may receive an attachment screw, for example. It should, however, be ensured that at least one end of the screw is provided with a layer of an electrically isolating material in order to avoid that the first cooling element 2 and the second cooling element 3 are electrically connected to each other via this screw.

In some implementations, it may be required that the first and/or second cooling element 2 and 3 is connected to one of the conductive paths 9 (there may be several conductive paths arranged on the layer 10 such that they are electrically isolated from each other). Such electrical connection may be accomplished by electrical wires connected to the inner surface 5 of the first cooling element 2 and the respective conductive path 9. Such electrical connection may be accomplished via direct soldering of the inner surface 15 of the second cooling element 3 to conductive path 9. Indirect connection of the second cooling element 3 can be achieved by wire-connection of the top electrodes of the semiconductor chip 4 and conductive path 9.

In accordance with an exemplary embodiment, the semiconductor elements 4 may be reverse conducting semiconductor switches, such as RC-IGBT:s (Reverse Conducting Insulated Gate Bipolar Transistor) or BiGT:s (Bi-mode insulated Gate Transistor), for example. Such semiconductor elements 4 combine two functionalities in the same silicon volume, in other words a switch and rectifier. The semiconductor elements 4 can be used in two modes, as a switch and as a freewheeling diode. With such semiconductor elements 4, the current/power density of the semiconductor device can be increased while efficient cooling is ensured. These semiconductor elements represent 4 a new generation of chips which were recently developed (focus on reverse conductive functionality during development). They allow much higher power and current density per module area. However, single side cooling is not sufficient to completely exploit benefits of the concept. Double side cooling of reverse conductive chips represents a chip-package combination allowing exploiting both concepts close to their limits and rich high current and power density in a power electronic module.

An advantage obtained with the semiconductor device 1 of the illustrated embodiment is that the internal wiring becomes minimal and simple, as electrical connection of the electrodes 8 and 13 of the semiconductor elements 4 can be accomplished via the cooling elements 2 and 3 without a need for additional internal wiring for this purpose. In addition, an efficient cooling is also obtained, as the generated heat load can be forwarded directly from the electrodes 8 and 13 to the cooling elements 2 and 3 without a need for arranging layers of electrically insulating material between the semiconductor elements 4 and the cooling elements 2 and 3.

Figure 4:
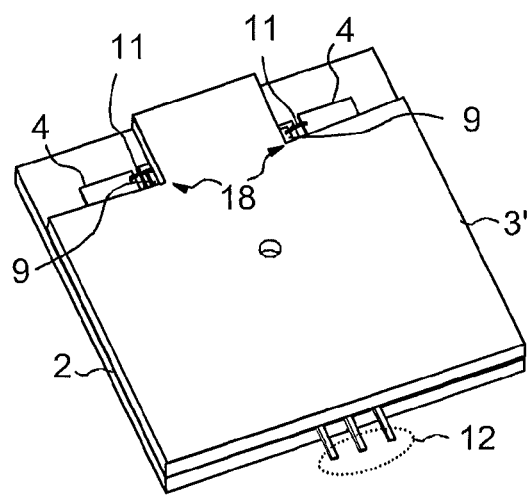
FIG. 4 illustrates an exemplary embodiment of a semiconductor device according to the present disclosure.

FIG. 4 illustrates an exemplary embodiment of a semiconductor device according to the present disclosure. The semiconductor device of FIG. 4 is very similar to the one illustrated in FIGS. 1-3, and therefore the embodiment of FIG. 4 is mainly explained by pointing out the differences between these embodiments.

In FIG. 4, the second cooling element 3' is provided with openings 18 which allow access to locations of internal wires 11 in the semiconductor device. Via these openings, electrical connection of the semiconductor elements 4 to the conductive paths 9 with wires 11 can be carried out after arranging the first and second cooling elements 2 and 3' on top of each other. In the illustrated example, only two openings 18 are shown in the upper corners of FIG. 4. However, openings may be arranged also to other parts of the second cooling element 3'. Alternatively, the first and second cooling element 2 and 3' may be of different size or shape in order to allow such access to the locations of the internal wires 11.

It is to be understood that the above description and the accompanying figures are only intended to illustrate exemplary embodiments of the present disclosure. It will be obvious to a person skilled in the art that the present disclosure can be varied and modified without departing from the scope of the disclosure.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A semiconductor device comprising:
   semiconductor elements;
   a cooling arrangement for cooling the semiconductor elements; and
   an interface which is electrically connected to gates of the semiconductor elements for controlling a respective state of the semiconductor elements, wherein:
   the semiconductor elements are reverse conducting semiconductor switches each including a first electrode and a second electrode, respectively, the first and second electrodes being arranged on opposite sides of the semiconductor elements, respectively;
   the cooling arrangement includes a first cooling element in contact with the first electrodes of the semiconductor elements for forwarding another heat load from the semiconductor elements to the first cooling element, the first cooling element being made of an electrically conductive material to electrically connect the first electrodes of the semiconductor elements to an external apparatus; and
   the cooling arrangement includes a second cooling element in contact with the second electrodes of the semiconductor elements for forwarding a heat load from the semiconductor elements to the second cooling element, the second cooling element being made of an electrically conductive material to electrically connect the second electrodes of the semiconductor elements to the external apparatus;
   the interface includes conductors protruding from the semiconductor device; and
   the interface is connected to the gates of the semiconductor elements via electrically conductive paths arranged on an inner surface of at least one of the first cooling element and the second cooling element, the electrically conductive paths being separated from the inner surface by a layer of an electrically insulating material.

2. The semiconductor device according to claim 1, wherein the interface is connected to the gates of the semiconductor elements via (i) a printed circuit board including the electrically conductive paths and the layer of an electrically insulating material and (ii) a ceramic structure with metallization including the electrically conductive paths and the layer of an electrically insulating material.

3. The semiconductor device according to claim 1, wherein at least one of the electrically conductive paths is electrically connected to the first cooling element.

4. The semiconductor device according to claim 1, wherein at least one of the electrically conductive paths is electrically connected to the second cooling element.

5. The semiconductor device according to claim 1, wherein a space between the first and second cooling elements is at least partly filled with an electrically isolating material.

6. The semiconductor device according to claim 1, wherein the first electrodes are bonded to the first cooling element by an electrically conductive material, and the second electrodes are bonded to the second cooling element by the electrically conductive material.

7. The semiconductor device according to claim 1, wherein the semiconductor elements are RC-IGBTs or BiGTs.

8. The semiconductor device according to claim 1, wherein the semiconductor device comprises a hole extending through the semiconductor device for receiving an attachment screw.

9. The semiconductor device according to claim 1, wherein the first and second cooling element are at least one of a different size and shape from each other.

10. The semiconductor device according to claim 1, wherein the interface is connected to the gates of the semiconductor elements via a ceramic structure with metallization including the electrically conductive paths and the layer of an electrically insulating material.

11. The semiconductor device according to claim 10, wherein at least one of the electrically conductive paths is electrically connected to the first cooling element.

12. The semiconductor device according to claim 10, wherein at least one of the electrically conductive paths is electrically connected to the second cooling element.

13. The semiconductor device according to claim 2, wherein at least one of the electrically conductive paths is electrically connected to the first cooling element.

14. The semiconductor device according to claim 2, wherein at least one of the electrically conductive paths is electrically connected to the second cooling element.

15. The semiconductor device according to claim 1, wherein at least one of the first and second cooling elements comprises at least one opening for providing access to locations of internal wires in the semiconductor device.

16. The semiconductor device according to claim 9, wherein at least one of the first and second cooling elements comprises at least one opening for providing access to locations of internal wires in the semiconductor device.

* * * * *